(12) United States Patent
Oguri (10) Patent No.: US 6,293,846 B1
(45) Date of Patent: Sep. 25, 2001

(54) POLISHING APPARATUS (75) Inventor: Shozo Oguri, Yokohama (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/050,087

(22) Filed: Mar. 30, 1998

(30) Foreign Application Priority Data

Jun. 17, 1997 (JP) .................................................. 9-177613

(51) Int. Cl.⁷ .............................. B24B 49/00; B24B 51/00
(52) U.S. Cl. ...................................................... 451/6; 451/5
(58) Field of Search ............................ 451/6, 5; 250/571

(56) References Cited

U.S. PATENT DOCUMENTS

| | | | | |
|---|---|---|---|---|
| 4,789,294 | * | 12/1988 | Sato et al. ............................... | 414/416 |
| 4,830,504 | * | 5/1989 | Frohardt et al. ....................... | 356/448 |
| 4,839,994 | * | 6/1989 | Heesemann ........................ | 51/165.72 |
| 4,945,253 | * | 7/1990 | Frohardt ................................ | 250/571 |
| 5,733,171 | * | 3/1998 | Allen et al. ................................ | 451/5 |
| 5,733,176 | * | 3/1998 | Robinson et al. ....................... | 451/41 |
| 5,823,853 | * | 10/1998 | Bartels et al. ............................ | 451/5 |
| 5,838,447 | * | 11/1998 | Hiyama et al. ....................... | 356/381 |
| 5,872,633 | * | 2/1999 | Holzapfel et al. .................... | 356/381 |
| 5,904,608 | | 5/1999 | Watanabe .................................. | 451/5 |
| 6,074,287 | * | 6/2000 | Miyaji et al. ......................... | 451/287 |

FOREIGN PATENT DOCUMENTS 9-85620   3/1997   (JP) .

* cited by examiner

*Primary Examiner*—Allen Ostrager
*Assistant Examiner*—William Hong
(74) *Attorney, Agent, or Firm*—Wenderoth, Lind & Ponack, L.L.P.

(57) ABSTRACT

A polishing apparatus has a turntable having a polishing surface thereon, and a top ring for holding a workpiece and pressing the workpiece against the polishing surface of the turntable. The workpiece can be polished by the polishing surface of the turntable while the turntable and the top ring are being rotated. A workpiece dislodgment detector is provided to detect the workpiece which is dislodged from the top ring. The workpiece dislodgment detector has a sensor provided adjacent to the top ring, and the sensor is preferably positioned alongside of the top ring and downstream of the top ring with respect to a direction in which the turntable is rotated.

8 Claims, 7 Drawing Sheets

| Evaluation Items | Various Sensors | Gloss Sensor | Laser Sensor (displacement detection type) | Color Difference Sensor No. 1 | Color Difference Sensor No. 2 |
|---|---|---|---|---|---|
| (1) Ability to detect different types of semiconductor wafers Wf | | detected | detected | not detected in some cases | not detected in some cases |
| (2) Ability to detect a semiconductor wafer Wf under room lighting | | detected | detected | detected | detected |
| (3) Ability to detect a semiconductor wafer Wf in the presence of water | supply to T/T | detected | detected | detected | detected |
| | supply to Wf | detected | detected | not detected in some cases | not detected in some cases |
| (4) Ability to detect a semiconductor wafer Wf in the presence of an abrasive solution | supply to T/T | detected | detected | detected | detected |
| | supply to Wf | detected | detected | not detected in some cases | not detected in some cases |
| (5) Ability to detect a particularly sized semiconductor wafer piece (Wf piece having a width of 10 mm) | | detected | not detected in some cases | detected | detected |
| (6) Ability to detect a particularly sized semiconductor wafer piece in the presence of water | supply to T/T | detected | detected in error | detected | detected |
| | supply to Wf | detected | detected | detected | detected |
| (7) Ability to detect a semiconductor wafer Wf when the sensor is covered with water | a small amount of mist water | detected | detected | detected | not detected in some cases |
| | a large amount of water droplets | detected | detected | detected | not detected in some cases |
| (8) Ability to detect a semiconductor wafer Wf while the semiconductor wafer Wf is polished with water | T/T 30rpm | detected | detected in error | | |
| | T/T 100rpm | detected | detected in error | | |

POLISHING APPARATUS

BACKGROUND OF THE INVENTION

1. Field of the Invention

The present invention relates to a polishing apparatus for polishing a workpiece such as a semiconductor wafer, and more particularly to a polishing apparatus having a workpiece dislodgment detector for detecting a workpiece which is dislodged from a top ring while the workpiece is being polished.

2. Description of the Prior Art

Recent rapid progress in semiconductor device integration demands smaller and smaller wiring patterns or interconnections and also narrower spaces between interconnections which connect active areas. One of the processes available for forming such interconnection is photolithography. Though the photolithographic process can form interconnections that are at most 0.5 $\mu$m wide, it requires that surfaces on which pattern images are to be focused by a stepper be as flat as possible because the depth of focus of the optical system is relatively small. Conventionally, as apparatuses for planarizing semiconductor wafers, there have been used a self-planarizing CVD apparatus, an etching apparatus or the like, however, these apparatuses fail to fully planarize semiconductor wafers. Recently, attempts have been made to use polishing apparatus for planarizing semiconductor wafers to a flatter finish with more ease than those conventional planarizing apparatus.

Conventionally, a polishing apparatus has a turntable and a top ring which rotate at respective individual speeds. A polishing cloth is attached to the upper surface of the turntable. A semiconductor wafer to be polished is placed on the polishing cloth and clamped between the top ring and the turntable. An abrasive liquid containing abrasive grains is supplied onto the polishing cloth and retained on the polishing cloth. During operation, the top ring exerts a certain pressure on the turntable, and the surface of the semiconductor wafer held against the polishing cloth is therefore polished by a combination of chemical polishing and mechanical polishing to a flat mirror finish while the top ring and the turntable are rotated. This process is called Chemical Mechanical polishing.

If a semiconductor wafer is transferred normally to the top ring, then the semiconductor wafer will not be dislodged or disengage from the top ring while the semiconductor wafer is being polished. However, if a semiconductor wafer is not transferred normally to the top ring, but is partially placed on a retainer ring of the top ring, the semiconductor wafer will tend to be dislodged from the top ring while the semiconductor wafer is being polished.

When the semiconductor wafer is dislodged, i.e., slipped out from the top ring, the semiconductor wafer is rotated with the turntable and collides with the top ring, with the result that the semiconductor wafer is liable to be damaged and/or to damage components of the polishing apparatus including the retainer ring for retaining the wafer therein, the polishing cloth on the turntable, a backing pad mounted on the lower surface of the top ring and supporting the semiconductor wafer, and a dressing tool mounted on a dressing apparatus. It has heretofore been customary to detect whether there is foreign matter on the polishing cloth by direct visual observation of the surface of the polishing cloth or image processing of the surface of the polishing cloth obtained by a television camera installed over the polishing cloth or the like.

The visual observation of the surface of the polishing cloth with the naked eye or the television camera fails to accurately detect foreign matter or a semiconductor wafer on the polishing cloth depending on the property of the semiconductor wafer, e.g., whether the detected surface thereof is polished to a mirror finish or a rough finish or carries an oxide layer, and also depending on whether there is water or an abrasive liquid on the polishing cloth, or the type of an abrasive liquid present on the polishing cloth.

If the surface of the polishing cloth is monitored with a monitoring device such as a television camera, then an output signal from the monitoring device is processed by a complex process such as an image processing to detect whether or not there is foreign matter on the polishing cloth, or whether or not the polishing cloth is defective. Because the complex process is time-consuming, it takes too much time after a semiconductor wafer is dislodged until the trouble is actually detected. Even if the polishing apparatus is shut down when the malfunction is actually detected, the semiconductor wafer will be damaged or broken, and damage to components of the polishing apparatus including th polishing cloth, the backing pad and the dressing tool can occur by the time the rotations of the turntable and the top ring are stopped.

Another problem with the image processing system is that since it needs a microcomputer capable of effecting high-speed computation for processing image information from the monitoring device at a high speed, the entire polishing apparatus is complex in structure and expensive to manufacture.

SUMMARY OF THE INVENTION

It is therefore an object of the present invention to provide a polishing apparatus having a workpiece dislodgment detector which can immediately detect a semiconductor wafer which is dislodged from a top ring while the semiconductor wafer is being polished, has a relatively simple arrangement in which an adjustment for detection can be effected only by establishing a threshold with respect to an output signal from a sensor, and is relatively inexpensive to manufacture.

According to one aspect of the present invention, there is provided a polishing apparatus for polishing a workpiece, comprising: a turntable having a polishing surface; a top ring for holding a workpiece and pressing the workpiece against the polishing surface of the turntable; and a workpiece dislodgment detector for detecting the workpiece which is dislodged from the top ring, the workpiece dislodgment detector including a sensor positioned adjacent to the top ring.

The workpiece dislodgment detector may comprise a photoelectric sensor for emitting light, receiving a reflected light and detecting the workpiece which is dislodged from the top ring based on a change in a quantity of the reflected light.

The photoelectric sensor may comprise a gloss sensor, and the gloss sensor may comprise a red light-emitting diode for emitting red light, a polarizing filter for allowing only S wave of the light from the red light-emitting dioxide to pass therethrough, and a beam splitter for separating the reflected light into S wave and P wave, and detecting the workpiece which is dislodged from the top ring based on a difference in glossiness.

The sensor of the workpiece dislodgment detector may be mounted directly or through an attachment on the top ring head.

The rotations of the turntable and the top ring may be stopped immediately when the workpiece dislodgment detector detects the workpiece which is dislodged from the top ring.

The top ring may be lifted immediately when the workpiece dislodgment detector detects the workpiece which is dislodged from the top ring.

The polishing apparatus may further have a bumper disposed around the turntable for dampening or cushioning movement of the workpiece dislodged from the top ring.

According to another aspect of the present invention, there is provided a method for polishing a workpiece by pressing the workpiece held by a top ring against a polishing surface on a turntable; detecting a dislodgment of the workpiece from the top ring during polishing; and stopping rotations of the turntable and the top ring when the dislodgment of the workpiece is detected.

According to still another aspect of the present invention, there is provided a method for polishing a workpiece by pressing the workpiece held by a top ring against a polishing surface on a turntable; detecting a dislodgment of the workpiece from the top ring during polishing; and lifting the top ring when the dislodgment of the workpiece is detected.

The above and other objects, features, and advantages of the present invention will become more apparent from the following description when taken in conjunction with the accompanying drawings in which preferred embodiments of the present invention are shown by way of illustrative example.

DETAILED DESCRIPTION OF THE PREFERRED EMBODIMENTS

Figure 1:
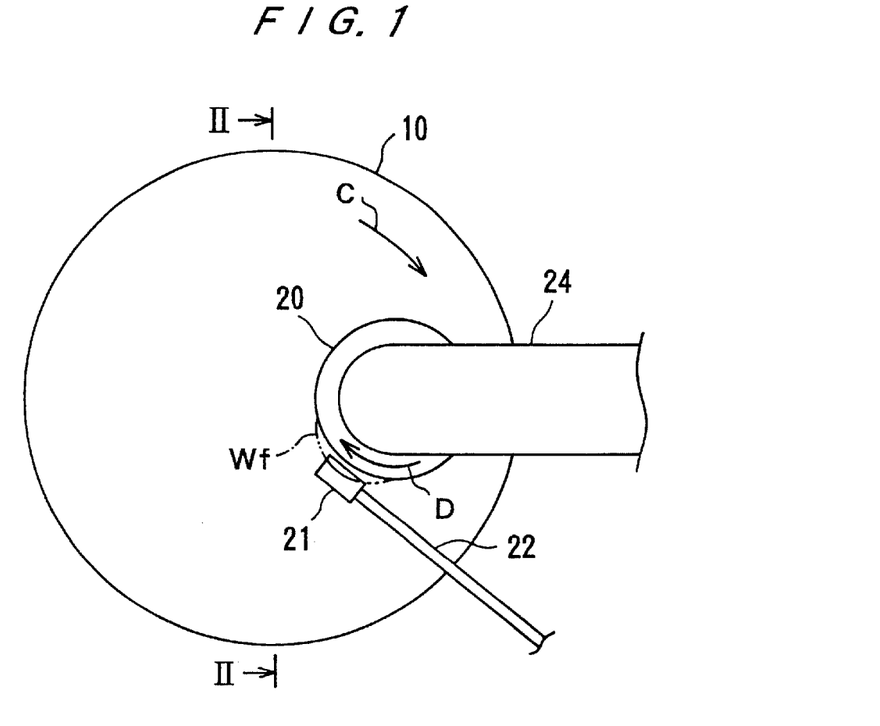
FIG. 1 is a plan view of an essential part of a polishing apparatus having a wafer dislodgment detector according to an embodiment of the present invention.
Figure 2:
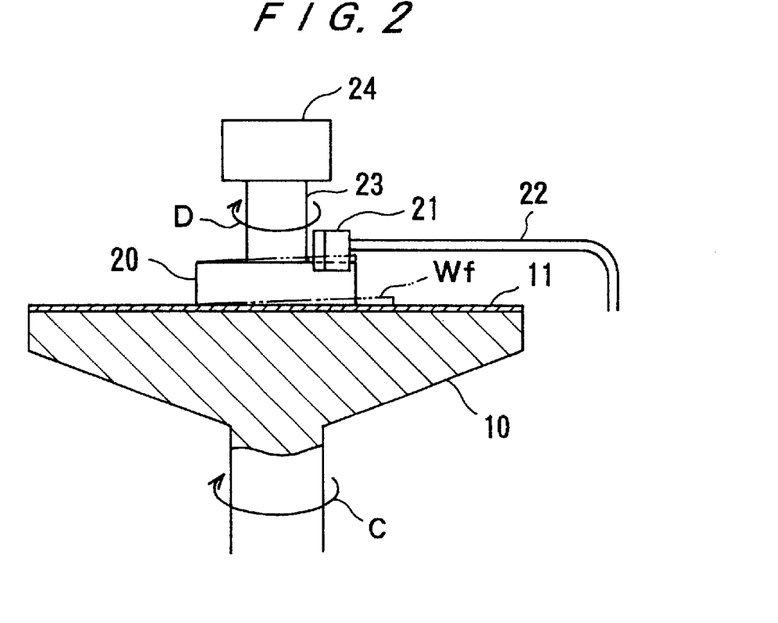
FIG. 2 is a cross-sectional view taken along line II—II of FIG. 1.

As shown in FIGS. 1 and 2, a polishing apparatus having a wafer dislodgment detector according to an embodiment of the present invention generally comprises a turntable 10 and a top ring 20. A polishing cloth 11 is mounted on an upper surface of the turntable 10, providing a polishing surface for polishing a workpiece such as a semiconductor wafer. When the polishing apparatus operates, the turntable 10 is rotated about its own axis in the direction indicated by the arrow C, and the top ring 20 is rotated about its own axis in the direction indicated by the arrow D.

A semiconductor wafer Wf is mounted on the top ring 20 and is pressed against the upper surface of the polishing cloth 11 on the turntable 10. The lower surface of the semiconductor wafer Wf is polished by a combination of chemical polishing and mechanical polishing while the turntable 10 is rotated in the direction indicated by the arrow C and the top ring 20 is rotated in the direction indicated by the arrow D. A wafer sensor unit 21 for detecting dislodgment of the semiconductor wafer Wf from the top ring 20 is supported on a sensor support arm 22 alongside of the top ring 20 and downstream of the top ring 20 with respect to the direction in which the turntable 10 is rotated. That is, the wafer sensor unit 21 is provided adjacent to the top ring 20. The distance between the outer periphery of the top ring 20 and the wafer sensor unit 21 is within 150 mm, preferably, within 30 mm.

The top ring 20 is supported by a top ring head 24 through a vertical shaft 23. The vertical shaft 23 is supported on the top ring head 24 and is rotatable by a rotating mechanism such as a motor(not shown).

The top ring head 24 is turned to a wafer transfer station where the top ring 20 receives a semiconductor wafer Wf from a transferring device such as a pusher so as to accommodate the semiconductor wafer Wf within a retainer ring, and holds the semiconductor wafer Wf under vacuum by the lower surface thereof. Then, the top ring head 24 is turned to position the top ring 20 over a predetermined position on the turntable 10, and the top ring 20 presses the lower surface of the semiconductor wafer Wf against the upper surface of the polishing cloth 11 on the turntable 10 to thus polish the lower surface of the semiconductor wafer Wf.

I the semiconductor wafer Wf is normally and properly received by the top ring 20 in the wafer transfer station, then since the semiconductor wafer Wf is placed within the retainer ring, the semiconductor wafer Wf is retained by the retainer ring against dislodgment when it is polished. However, if the semiconductor wafer wf is not normally received by the top ring 20 in the wafer transfer station and is partially placed on the retainer ring, then the top ring 20 is tilted and the semiconductor wafer Wf projects partly from the circumferential edge of the top ring as indicated by the two-dot chain line in FIGS. 1 and 2.

The semiconductor wafer Wf thus displaced from the top ring 20 is detected by the wafer sensor unit 21. In response to an output signal from the wafer sensor unit 21, the rotations of the turntable 10 and the top ring 20 are immediately stopped to prevent the semiconductor wafer Wf, the polishing cloth 11 on the turntable 10, and other components including the backing pad and the dressing tool (described later on) from being damaged.

Figure 3:
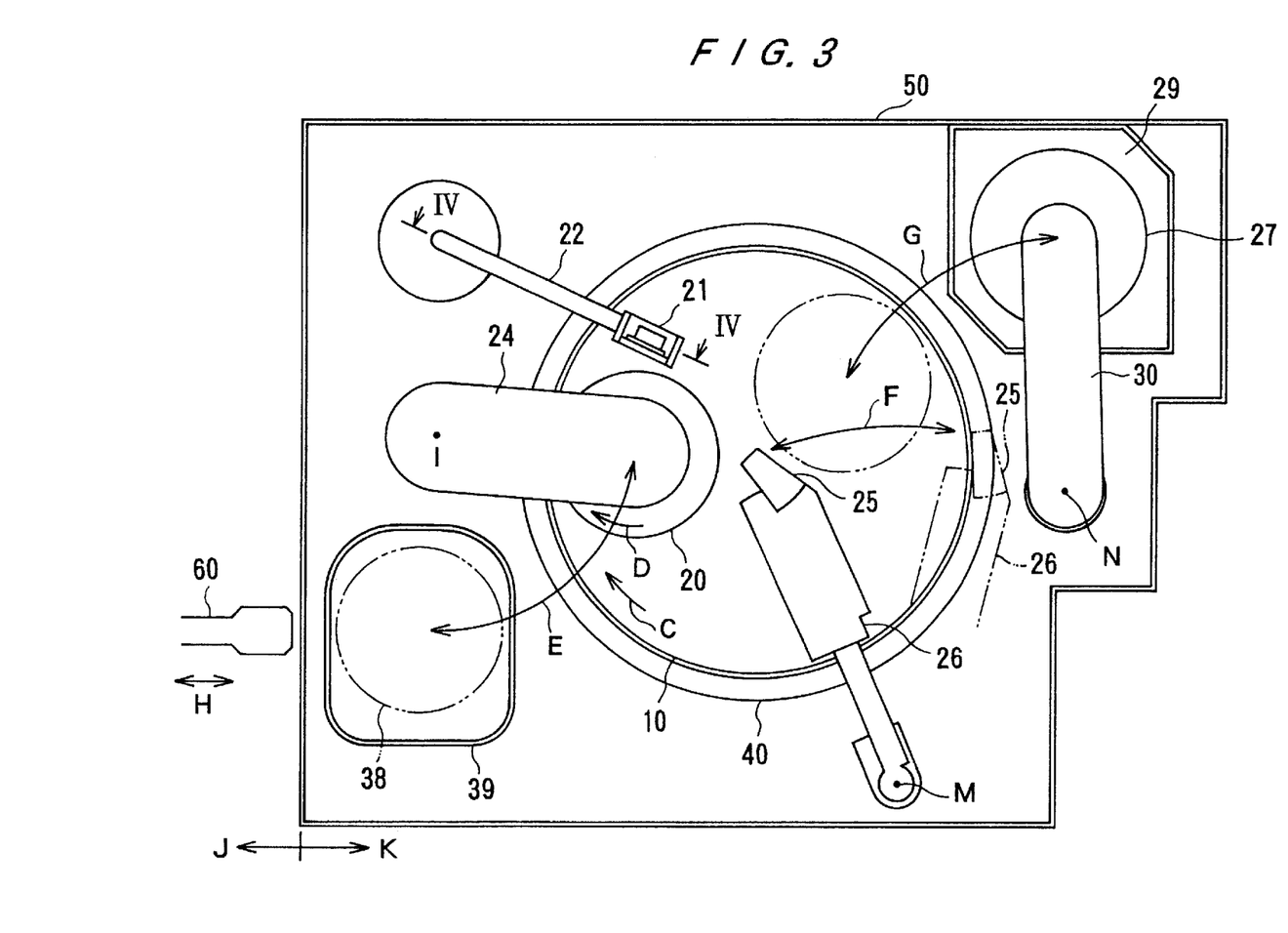
FIG. 3 is a plan view of the polishing apparatus shown in FIG. 1.
Figure 4:
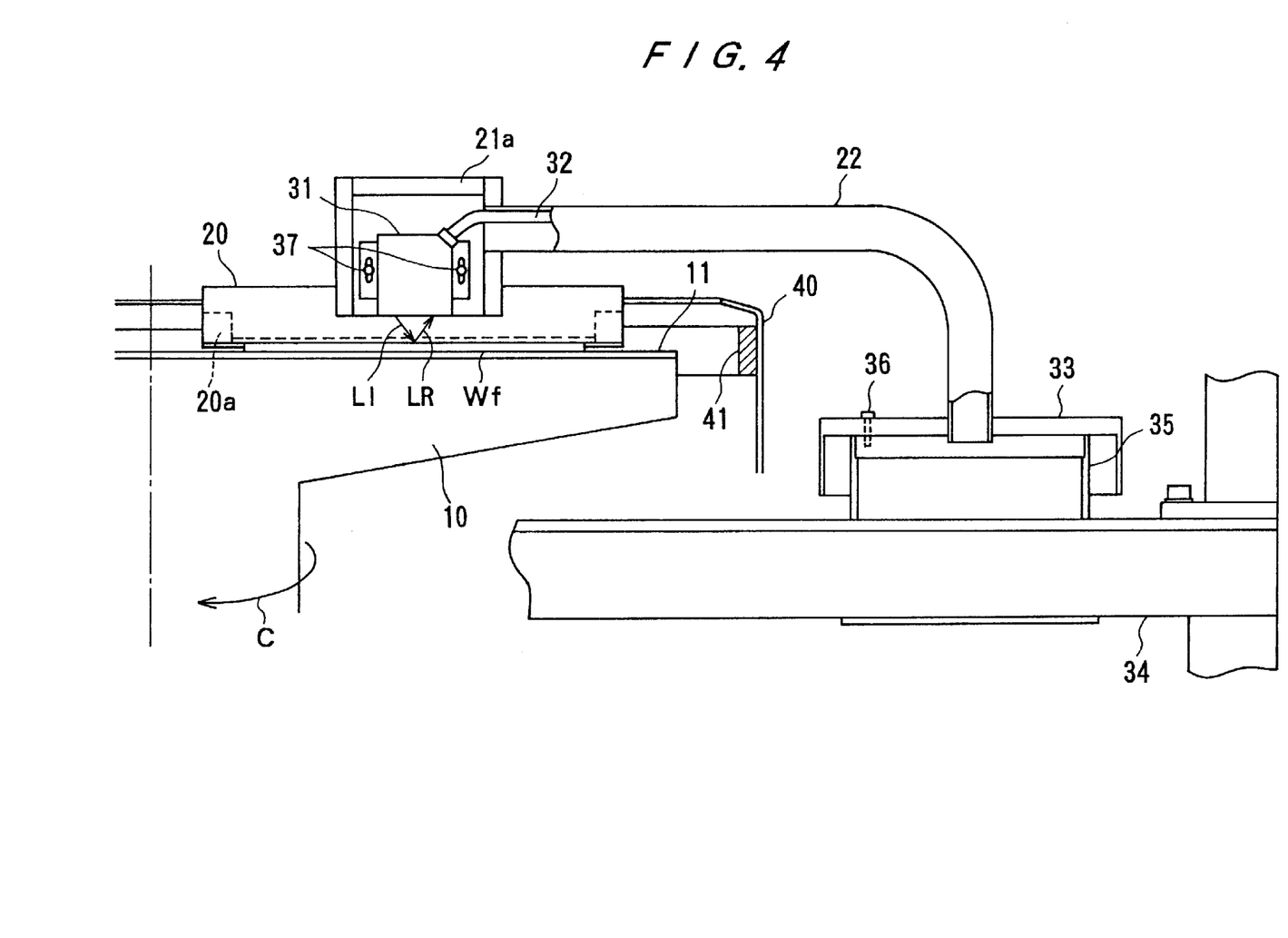
FIG. 4 is an enlarged cross-sectional view taken along line IV—IV of FIG. 3.
Figure 5:
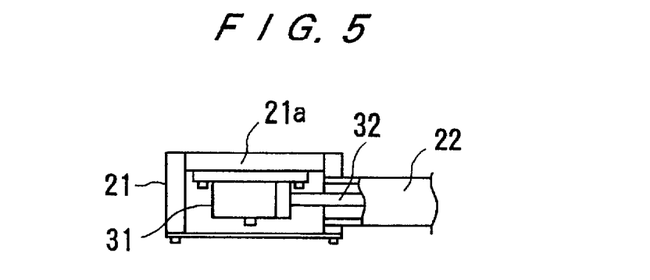
FIG. 5 is a plan view of a wafer sensor unit shown in FIG. 4.

FIGS. 3 through 5 show in detail the polishing apparatus shown in FIGS. 1 and 2. As shown in FIG. 3, the polishing apparatus has a housing 50 accommodating therein the turntable 10, the top ring 20, the wafer sensor unit 21, an abrasive liquid nozzle 25, a dresser 27, and a cover 40.

The turntable 10 is positioned centrally in the housing 50 and is rotatable in the direction indicated by the arrow C by a rotating mechanism (not shown). The polishing cloth 11 is attached to the upper surface of the turntable 10. The top ring 20 can be angularly moved by the top ring head 24 about its own axis I in the directions indicated by the arrow E. The top ring 20 is angularly movable between a polishing position indicated by the solid line over the turntable 10 and a wafer transfer station 38 indicated by the two-dot chain line and located outside the turntable 10.

A loading/unloading section and a cleaning section are positioned at the side indicated by the arrow J, and a polishing section is positioned at the side indicated by the arrow K. The wafer transfer station 38 has a pusher (not shown) for receiving a semiconductor wafer Wf to be polished from a robot arm 60, transferring the semiconductor wafer Wf to be polished to the top ring 20, receiving a polished semiconductor wafer Wf from the top ring 20, and transferring the polished semiconductor wafer Wf to the robot arm 60. The wafer transfer station 38 has its sides and bottom surrounded by a casing 39 disposed within the housing 50. The wafer transfer station 38 has a cleaning mechanism (not shown) for cleaning the robot arm 60, the pusher, and the top ring 20.

As shown in FIGS. 4 and 5, the wafer sensor unit 21 comprises a photoelectric sensor 31 mounted on a sensor holder 21a fixed to the distal end of the sensor support arm 22. The photoelectric sensor 31 is vertically adjustable in position by a screw adjustment mechanism 37. A quantity LI of light emitted from the photoelectric sensor 31 and a quantity LR of light reflected to the photoelectric sensor 31 can be adjusted when the photoelectric sensor 31 is vertically adjusted in position with respect to the sensor holder 21a by the screw adjustment mechanism 37. An input/output cable 32 extending through the sensor support arm 22 is connected to the photoelectric sensor 31.

The sensor support arm 22 has another end fixed to a base 33 which is fastened by bolts 36 to a bracket 35. Further, the bracket 35 is secured to a frame 34 of the polishing apparatus. As described above, the wafer sensor unit 21 is positioned alongside of the top ring 20 and downstream of the top ring 20 with respect to the direction in which the turntable 10 is rotated.

The sensor support arm 22 may be angularly moved by a rotating mechanism (not shown) mounted on the base 33 or the bracket 35 or positionally adjusting the wafer sensor unit 21.

FIG. 3, the abrasive liquid nozzle 25 serves to supply an abrasive liquid to the polishing cloth 11 on the turntable 10. The abrasive liquid nozzle 25 is fixed to the distal end of an abrasive liquid nozzle arm 26, and is angularly movable by the abrasive liquid nozzle arm 26 about an axis M in the directions indicated by the arrow F between an abrasive liquid supply position indicated by the solid line over the turntable 10 and a standby position indicated by the two-dot chain line and positioned outside the turntable 10. The abrasive liquid nozzle 25 is supplied with an abrasive liquid from an abrasive liquid supply pipe (not shown) extending through the abrasive liquid nozzle arm 26.

The dresser 27 carries the dressing tool attached to its lower surface and composed of diamond grains or SiC. The dressing too is held against the polishing cloth 11 to dress the polishing cloth 11 for thereby removing surface undulations or irregularities that have been caused by the polishing action of the polishing cloth 11. The dresser 27 is supported on a dresser arm 30 and is rotatable about its own axis by a rotating mechanism (not shown). The dresser 27 is also angularly movable by the dresser arm 30 about an axis N in the directions indicated by the arrow G between a standby station 29 indicated by the solid line and positioned outside the turntable 10 and an operative position indicated by the two-dot chain line over the turntable 10. The standby station 29 has a dresser cleaning mechanism (not shown) for cleaning the dresser 27. The cover 40 surrounds the turntable 10 and serves to prevent slurry and particles that are produced when the semiconductor wafer Wf is polished from being scattered out of the turntable 10.

Operation of the polishing apparatus will be described below.

A semiconductor wafer Wf to be polished which has been delivered by the robot arm 60 is transferred to the pusher in the wafer transfer station 38. Then, the semiconductor wafer Wf to be polished is transferred to the top ring 20 in the wafer transfer station 38. The top ring 20 holds the semiconductor wafer Wf to be polished under vacuum by the lower surface thereof, and is then turned in the direction indicated by the arrow E (radially inwardly with respect to the turntable 10) to the polishing position over the turntable 10. In the polishing position, the top ring 20 presses the semiconductor wafer Wf against the upper surface of the polishing cloth 11, and releases the semiconductor wafer Wf from the vacuum attraction. The turntable 10 is rotated in the direction indicated by the arrow C and the top ring 20 is rotated in the direction indicated by the arrow D for thereby polishing the lower surface of the semiconductor wafer Wf while the semiconductor wafer Wf is being pressed against the polishing cloth 11. While the semiconductor wafer Wf is being thus polished, the abrasive liquid nozzle 25 supplies an abrasive liquid onto the polishing cloth 11.

After the semiconductor wafer Wf is polished, the top ring 20 holds the semiconductor wafer Wf again under vacuum, is turned in the direction indicated by the arrow E (radially outwardly with respect to the turntable 10) to the wafer transfer station 38, and transfers the polished semiconductor wafer Wf to the pusher in the wafer transfer station 38. The robot arm 60 receives the polished semiconductor wafer Wf from the pusher, and carries the polished semiconductor wafer Wf to the cleaning section.

If the semiconductor wafer Wf to be polished is normally and properly transferred from the pusher to the top ring 20, then the semiconductor wafer Wf is placed within the retainer ring 20a (see FIG. 4). While the semiconductor wafer Wf is being polished, the semiconductor wafer Wf is kept within the top ring 20 by the retainer ring 20a against radially outward dislodgment regardless of frictional forces acting on the semiconductor wafer Wf by relative movement of the polishing cloth 11 and the semiconductotr wafer Wf and surface tension acting on the semiconductor wafer Wf by the abrasive liquid.

Figure 6:
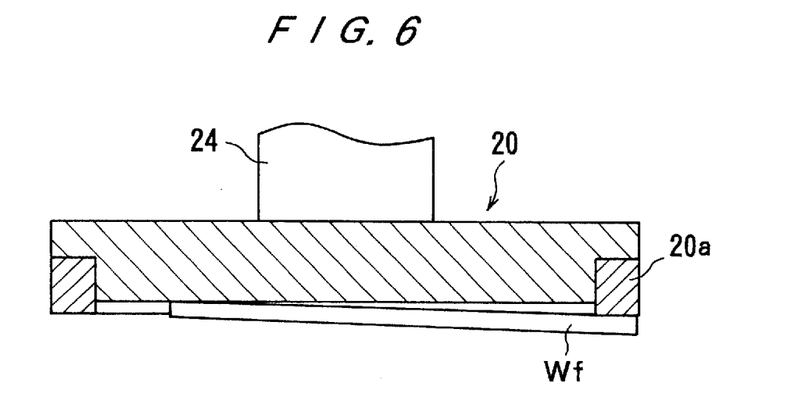
FIG. 6 is a cross-sectional view showing the manner in which a semiconductor wafer is not normally mounted on a top ring.

If the semiconductor wafer Wf to be polished is not normally transferred from the pusher to the top ring 20, then as shown in FIG. 6, the semiconductor wafer Wf is partially placed on the retainer ring 20a of the top ring 20. When the semiconductor wafer Wf partially placed on the retainer ring 20a is pressed against the polishing cloth 11 and polished, the semiconductor wafer Wf can easily be dislodged, i.e. slip out of the top ring 20 under frictional forces acting on the semiconductor wafer Wf by relative movement of the polishing cloth 11 and the semiconductor wafer Wf and surface tension acting on the semiconductor wafer Wf by the abrasive liquid.

When the semiconductor wafer WF is dislodged out of the top ring 20, the semiconductor wafer WF rotates with the turntable 10. Upon one revolution of the turntable 10, the semiconductor wafer WF collides with the top ring 20. Therefore, the semiconductor wafer WF itself, and components constituting the top ring 20 and including the retainer ring 20a and the backing pad (which comprises an elastic film mounted on the lower surface of the top ring 20) are liable to be damaged. When the semiconductor wafer WF collides with the top ring 20, the semiconductor wafer WF is expelled thereby into collision with the components of the polishing apparatus including the polishing cloth 11, the dresser 27 and the like. Therefore, the semiconductor wafer WF itself, and the components including the polishing cloth 11 and the dressing tool also tend to be damaged.

According to the present invention, as shown in FIG. 4, when the semiconductor wafer WF is dislodged out of the top ring 20, the semiconductor wafer WF is immediately detected by the photoelectric sensor 31, which applies an output signal to a control device to thereby stop the rotations of the turntable 10 and the to ring 20. Simultaneously, the top ring 20 may also be elevated by a lifting/lowering mechanism (not shown) such as an air cylinder disposed in the top ring head 24. Consequently, the polishing process is interrupted before the turntable 10 makes one revolution and the dislodged semiconductor wafer WF collides with the top ring 20, so that the semiconductor wafer WF and the components of the polishing apparatus are effectively protected against damage.

A bumper 41 made of a cushioning material is disposed around the turntable 10, e.g., on an inner surface of the cover 40, for protecting the semiconductor wafer Wf against damage even when the semiconductor wafer Wf is dislodged from the top ring 20 and its edge hits the bumper 41. The bumper 41 is made of polyurethane or the like, and is of a substantially cylindrical shape extending along the inner surface of the cover 40. Even when the semiconductor wafer wf is dislodged from the top ring 20 and is expelled radially outwardly, movement of the semiconductor wafer Wf outwardly is resiliently dampened or cushioned by the bumper 41, and hence the wafer is protected against cracking.

The dislodged semiconductor wafer Wf is detected by the photoelectric sensor 31 as follows: The photoelectric sensor 31 emits quantity LI of light toward the polishing cloth 11, and detects quantity LR of reflected light. The differential value between the quantities LI, LR of light when the quantity LR of light is reflected by the dislodged semiconductor wafer Wf below the photoelectric sensor 31 differs from the differential value between the quantities LI, LR of light when the quantity LR of light is reflected in such a state that there is no dislodged semiconductor wafer Wf below the photoelectric sensor 31. If the photoelectric sensor 31 emits a constant quantity LI of light toward the polishing cloth 11 at all times, then the quantity LR of light reflected by the dislodged semiconductor wafer Wf below the photoelectric sensor 31 differs from the quantity LR of light reflected when there is no dislodged semiconductor wafer Wf below the photoelectric sensor 31. Therefore, a dislodged semiconductor or wafer Wf below the photoelectric sensor 31 can be detected on the basis of a change in the differential value between the quantities LI, LR of light, or a change in the quantity LR of reflected light if the quality LI of light is constant.

The photoelectric sensor 31 which operates under the above principle may not accurately detect whether there is a dislodged semiconductor wafer Wf because the reflected light has a different intensity depending on the property of the semiconductor wafer Wf, e.g., whether the detected surface thereof is polished to a mirror finish a rough finish or carries an oxide layer. Such a drawback can be eliminated by employing a gloss sensor (or gloss meter) as the photoelectric sensor 31.

Figure 7:
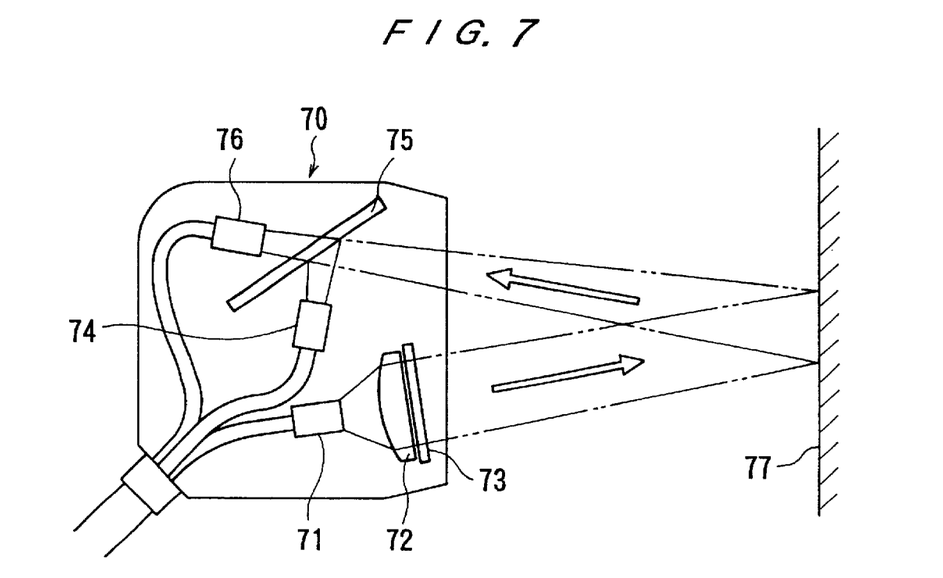
FIG. 7 is a schematic view of a gloss sensor as a wafer dislodgment detector.

As shown in FIG. 7, a gloss sensor comprises a light-emitting element 71 having a red light-emitting diode for emitting red light, a lens 72 and a polarizing filter 73 for allowing only S wave (perpendicular light) to pass therethrough, whereby only the S wave is applied to a surface 77 to be detected. The gloss sensor 70 further comprises a beam splitter 75. If the surface 77 to be detected is glossy, then the S wave (secondary wave) is reflected by the surface 77 and is applied to a beam splitter 75 which reflects the S wave into an optical fiber 74. If the surface 77 to be detected is not glossy, then the S wave is diffused, with the result that the directions of polarization become random. As a result, P wave (parallel light) is produced, and passes through the beam splitter 75 into an optical fiber 76. Signals indicative of the S wave and the P wave (primary wave) that have traveled through the respective optical fibers 74, 76 are processed to distinguish the difference in glossiness of the surface 77.

Figure 8:
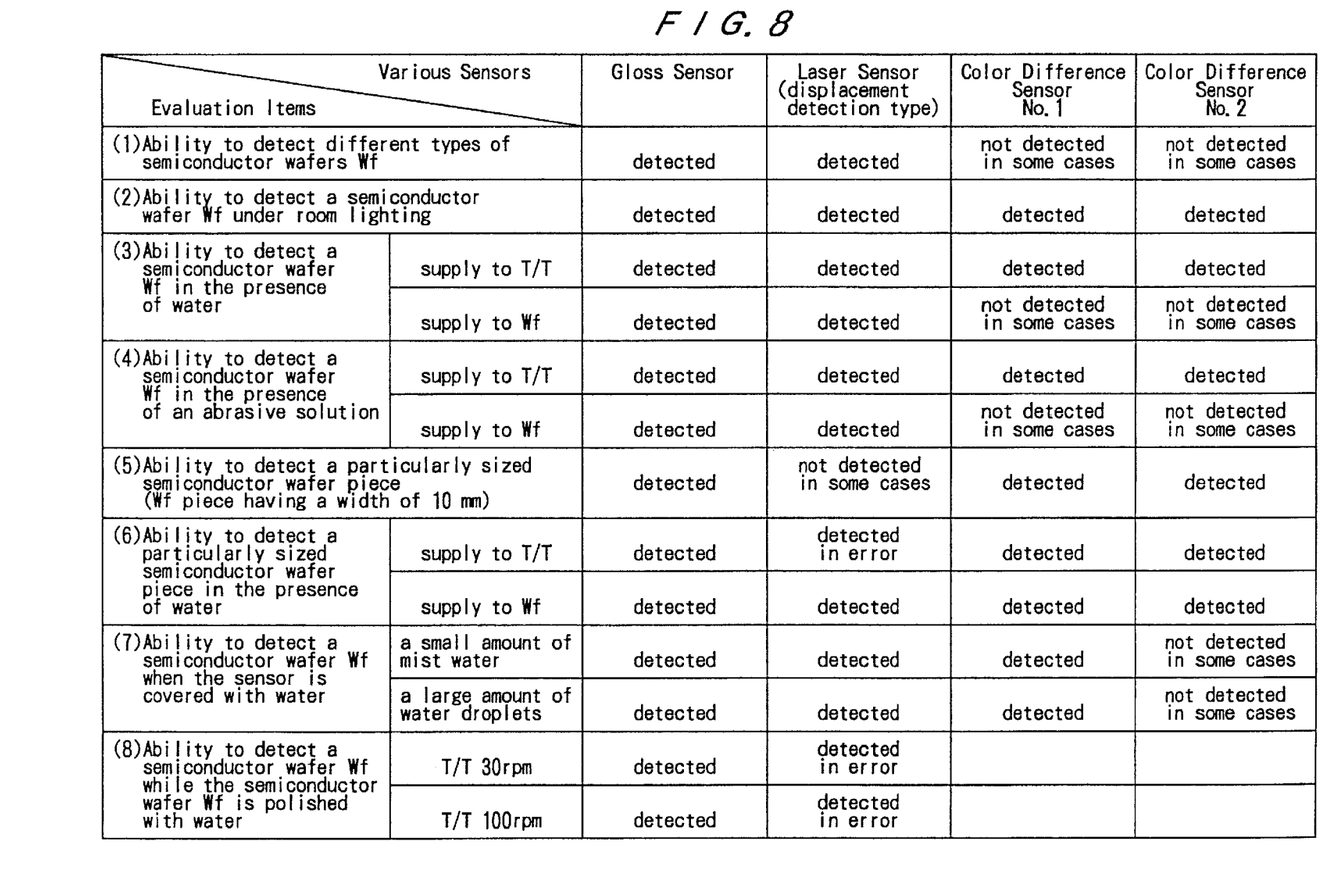
FIG. 8 is a table showing performance evaluations of various sensors.

FIG. 8 is a table showing performance evaluations of various sensors including a gloss sensor, a laser sensor (of the displacement detection type), a color difference sensor No. 1, and a color difference sensor No. 2. Evaluation items include (1) the ability to detect different types of semiconductor wafers Wf, (2) the ability to detect a semiconductor wafer Wf under room lighting, (3) the ability to detect a semiconductor wafer Wf in the presence of water, (4) the ability to detect a semiconductor wafer Wf in the presence of an abrasive liquid, (5) the ability to detect a particularly sized semiconductor wafer piece, (6) the ability to detect a particularly sized semiconductor wafer piece in the presence of water, (7) the ability to detect a semiconductor wafer Wf when the sensor is covered with water, and (8) the ability to detect a semiconductor wafer Wf while the semiconductor wafer Wf is polished with water under various polishing conditions.

As for the evaluation item (1), in the case where a threshold was established so that one of a bare semiconductor wafer and a semiconductor wafer having an oxide layer thereon could be detected, whether or not the other of those semiconductor wafers could be detected was examined. As a result, both the gloss sensor and the laser sensor of the displacement detection type detected both types of the semiconductor wafers Wf, but the color difference sensors Nos. 1 and 2 failed to detect the semiconductor wafer Wf in some cases.

A for the evaluation item (2), whether or not the semiconductor wafer could be detected under room lighting was examine. As a result, all the sensors detected the semiconductor wafer Wf under room lighting.

As for the evaluation item (3), when water was supplied at a rate of 0.5 liter/min. to the polishing cloth on the turntable (T/T) or the semiconductor wafer Wf, whether or not the semiconductor wafer could be detected was examined. As a result, all the sensors detected the semiconductor wafer Wf when water was supplied to the polishing cloth on the turntable (T/T). When water was supplied to the semiconductor wafer Wf, the gloss sensor and the laser sensor detected the semiconductor wafer Wf, but the color difference sensors Nos. 1 and 2 failed to detect the semiconductor wafer Wf in some cases.

As for the evaluation item (4), when an abrasive liquid was supplied at a rate of 0.5 liter/min. to the polishing cloth on the turntable (T/T) or the semiconductor wafer Wf, whether or not the semiconductor wafer could be detected was examined. As a result, all the sensors detected the semiconductor wafer Wf when the abrasive liquid was supplied to the polishing cloth on the turntable (T/T). When the abrasive liquid was supplied to the semiconductor wafer Wf, the gloss sensor and the laser sensor detected the semiconductor wafer Wf, but the color difference sensors Nos. 1 and 2 failed to detect the semiconductor wafer Wf in some cases.

A for the evaluation item (5), whether or not the semiconductor wafer piece having a width of 10 mm could be detected was examined. As a result, the gloss sensor and the color difference sensors Nos. 1 and 2 detected the semiconductor wafer piece, but the laser sensor failed to detect the semiconductor wafer piece in some cases.

As for the evaluation item (6), when water was supplied to the polishing cloth on the turntable (T/T) or the semiconductor wafer Wf, whether or not the semiconductor wafer piece having a width of 10 mm could be detected was examined. As a result, the gloss sensor and the color difference sensors Nos. 1 and 2 detected the semiconductor wafer piece and the laser sensor detected the semiconductor wafer piece in error in some cases when water was supplied to he polishing cloth on the turntable (T/T). All the sensors detected the semiconductor wafer piece when water was supplied to the semiconductor wafer piece.

A for the evaluation item (7), when the sensors were covered with a small amount of mist water or a large amount of water droplets, whether or not the semiconductor wafer could be detected was examined. As a result, the gloss sensor, the laser sensor, and the color difference sensor No. 1 detected the semiconductor wafer Wf when the sensors were covered with a small quantity of mist water or a large quantity of water droplets, but the color difference sensor No. 2 failed to detect the semiconductor wafer Wf in some cases when the sensor was covered with a small quantity of mist water or a large quantity of water droplets.

As for the evaluation item (8), when the semiconductor wafer was polished with water while the turntable (T/T) was rotated at 30 rpm and the top ring was rotated at 30 rpm, or while the turntable (T/T) was rotated at 100 rpm and the top ring was rotated at 30 rpm, whether or not the semiconductor wafer could be detected was examined. As a result, the gloss sensor detected the semiconductor wafer Wf, but the laser sensor detected the semiconductor wafer in error in some cases.

As shown in FIG. 8, the gloss sensor accurately detected semiconductor wafer Wf under any of the above evaluation items (1) through (8). While the laser sensor, the color difference sensor No. 1, and the color difference sensor No. 2 produced essentially good results, the laser sensor suffered detection errors or detection failures with respect the evaluation items (5), (6) and (8), and the color difference sensor No. 1 and the color difference sensor No. 2 suffered detection errors or detection failures with respect the evaluation items (1), (3) and (4). Therefore, the laser sensor, the color difference sensor No. 1, and the color difference sensor No. 2 exhibited insufficient performance stability for polishing processes using an ordinary polishing cloth and abrasive liquid.

As described above, the gloss sensor exhibited good performance stability for polishing processes using an ordinary polishing cloth and abrasive liquid. In FIG. 8, IC1000 (sold by Rodel, Inc.) which is white and Politex (sold by Rodel, Inc.) which is black were used as polishing cloths, and SC-1 (sold by Cabot Corporation) which is white and WA355 (sold by Cabot Corporation) which is yellow were used as abrasive liquids. Further, it was confirmed that the laser sensor and the color difference sensors were able to accurately detect dislodgment of the semiconductor wafer from the top ring under certain polishing conditions and polishing environments using certain polishing cloths and abrasive liquids. Therefore, the photoelectric sensor 31 may comprise not only a gloss sensor, but also a laser sensor of the displacement detection type or a color difference sensor.

Figure 9:
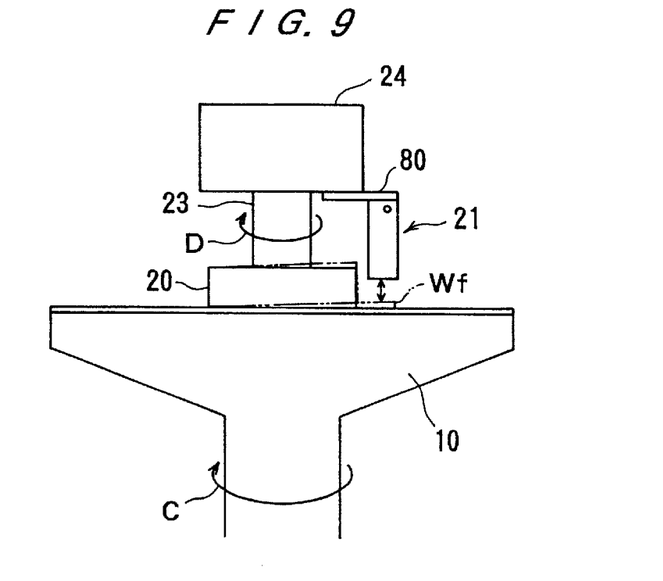
FIG. 9 is a front view of a polishing apparatus having a modified wafer dislodgment detector.
Figure 10:
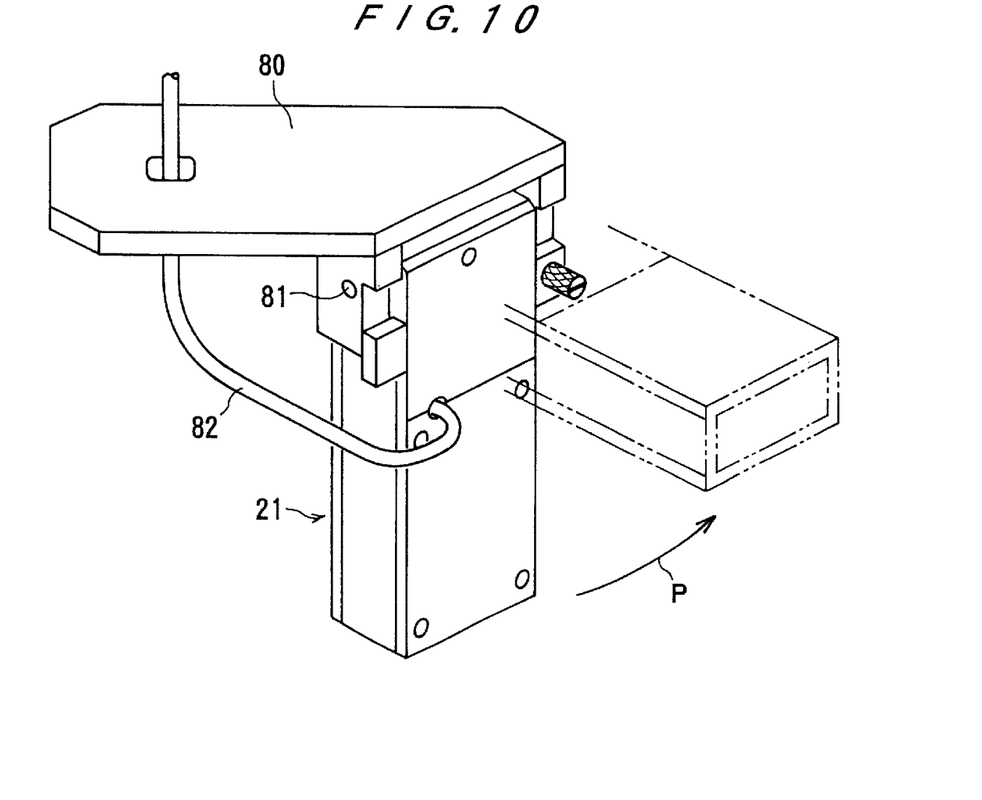
FIG. 10 is an enlarged perspective view of a wafer sensor unit attachment of the modified polishing apparatus shown in FIG. 9.

In the above embodiment, the wafer sensor unit 21 is supported on the sensor support arm 22 alongside of the top ring 20 and downstream of the top ring 20 with respect to the direction in which the turntable 10 is rotated. However, as shown in FIG. 9, the wafer sensor unit 21 may be mounted through an attachment 80 on the distal end of the top ring head 24. As shown in FIG. 10, the wafer sensor unit 21 is angularly vertically movable about a shaft 81 in the direction indicated by the arrow P, so that the wafer sensor unit 21 can be lifted up to an area where the top ring 20 and nearby components will be serviced for maintenance.

FIG. 10, the wafer sensor unit 21 houses therein the gloss sensor 70 shown in FIG. 7, and light is transmitted to the light-emitting element 71 from a signal processor capable of photoelectric conversion and signal processing through an optical fiber cable 82, and light from the optical fibers 74, 76 is transmitted to the signal processor through the optical fiber cable 82.

When the wafer sensor unit 21 detects dislodgment of the semiconductor wafer Wf from the top ring, the wafer sensor unit 21 produces an output signal which is sent to the signal processor that immediately stops the rotations of the turntable 10 and the top ring 20.

Figure 11:
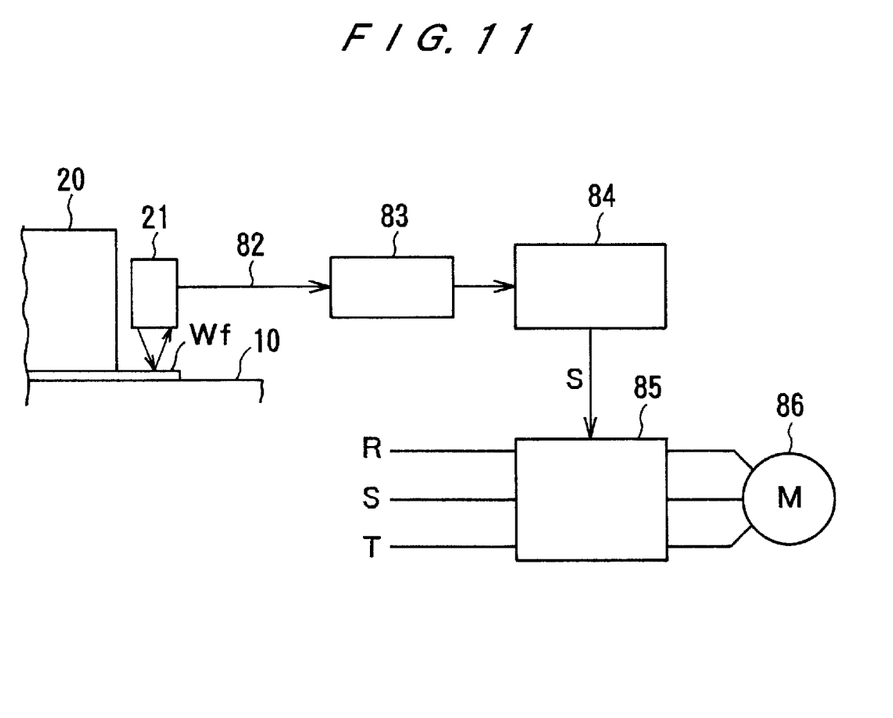
FIG. 11 is a block diagram of a turntable rotating system.

FIG. 11 shows in block diagram a turntable rotating system for rotating the turntable 10. As shown in FIG. 11, the turntable rotating system has a drive motor controller 85 for controlling a drive motor 86 to thereby rotate the turntable 10 at a given rotational speed.

An output signal from the wafer sensor unit 21 is transmitted through the optical fiber cable 82 to a photoelectric transducing and amplifying unit 83 which converts the signal into an electric signal and amplifies the electric signal. The amplified electric signal is inputted into a signal processor 84 which processes the electric signal. In this manner, when dislodgment of the semiconductor wafer Wf from the top ring 20 is detected, the signal processor 84 sends a regenerative braking command signal S to the drive motor controller 85, which applies regenerative braking to the drive motor 86.

In the above embodiment, the turntable 10 is stopped by regenerative braking. However, such a regenerative braking system may be replaced with or assisted by a mechanical braking system which includes a brake drum combined with the turntable 10 and a brake shoe that can be pressed against the brake drum in response to a braking command signal from the signal processor 84. The rotation of the top ring 20 may be stopped by a regenerative braking system and/or a mechanical braking system, or alternatively, the power supply to the motor for rotating the top ring 20 may simply be turned off because the inertia force of the top ring 20 is relatively small.

Since the wafer sensor unit 21 employs a photoelectric sensor such as a gloss sensor for detecting dislodgment of the semiconductor wafer Wf from the top ring 20, dislodgment of the semiconductor wafer Wf from the top ring 20 can be detected reliably in a short time simply by establishing a predetermined threshold for processing an output signal from the photoelectric sensor without effecting complicated processing. Therefore, the rotations of the turntable 10 and the top ring 20 can be stopped quickly for protecting the semiconductor wafer Wf and components of the polishing apparatus against damage.

As is apparent from the above description, according to the present invention, since the wafer dislodgment detector is provided alongside of the top ring within a distance of 150 mm from the top ring and downstream of the top ring with respect to a direction in which the turntable is rotated, the semiconductor wafer which is dislodged from the top ring can be accurately detected during polishing. If the dislodgment of the semiconductor wafer is detected, then the polishing operation can be immediately stopped to prevent the semiconductor wafer, and components of the polishing apparatus including the retainer ring, the polishing cloth, the backing pad and the dressing tool from being damaged. In the above embodiments, the cause of the dislodgment of the semiconductor wafer is a failure of transferring between the transferring device and the top ring, but the cause of the dislodgment is not so restricted. Even if the semiconductor wafer is normally and properly transferred to the top ring, the semiconductor wafer may be dislodged from the top ring through the gap between the lower surface of the top ring and the upper surface of the polishing cloth during a polishing process.

Although certain preferred embodiments of the present invention have been shown and described in detail, it should be understood that various changes and modifications may be made therein without departing from the scope of the appended claims.

What is claimed is:

1. A polishing apparatus for polishing a workpiece, said apparatus comprising:
   a turntable having a polishing surface;
   a top ring for holding a workpiece and pressing the workpiece against said polishing surface of said turntable;
   a workpiece dislodgment detector for detecting, during a polishing operation, the situation that the workpiece is dislodged from said top ring, said detector comprising a photoelectric gloss sensor for emitting light, receiving reflected light and detecting the workpiece that is dislodged from said top ring based on a change in a quantity of said reflected light, said sensor comprising a light-emitting diode for emitting light, a polarizing filter for allowing only S wave of the light from said light-emitting diode to pass therethrough, and a beam splitter for separating said reflected light into S wave and P wave, thus detecting the workpiece that is dislodged based on a difference in glossiness.

2. A polishing apparatus for polishing a workpiece, said apparatus comprising:
   a rotatable turntable having a polishing surface;
   a single rotatable top ring for holding a single workpiece and pressing the workpiece against said polishing surface of said turntable;
   said turntable and said top ring having respective configurations such that only a single workpiece at a time can be polished;
   a workpiece dislodgment detector for, during a polishing operation, detecting the situation that the workpiece is dislodged from said top ring said detector comprising a photoelectric gloss sensor for emitting light, receiving reflected light and detecting the workpiece that is dislodged from said top ring based on a change in a quantity of said reflected light, said gloss sensor comprising a light-emitting diode for emitting light, a polarizing filter for allowing only S wave of the light from said light-emitting diode to pass therethrough, and a beam splitter for separating the reflected light into S wave and P wave, thus detecting the workpiece that is dislodged based on a difference in glossiness.

3. A method for polishing a workpiece, said method comprising:
   holding a single workpiece to be polished by a single top ring,, and pressing said single workpiece against a polishing surface of a turntable by said single top ring, while rotating said turntable and said single top ring, thereby polishing said workpiece;
   detecting the situation of dislodgement of said workpiece from said top ring by a workpiece dislodgement detector comprising a gloss sensor for emitting light, receiving reflected light and detecting said workpiece that is dislodged from said top ring based on a change in a quantity of said reflected light; and
   upon detection of a dislodged workpiece, lifting said top ring away from said turntable;
   wherein the detecting of the situation of dislodgement of said workpiece from said top ring comprises:
   (i) emitting light;
   (ii) reflecting the emitted light from at least one of said polishing surface and said workpiece; and then
   (iii) receiving the light at at least one of two receiving portions of said gloss sensor,
   and wherein the receiving of the light comprises passing the reflected light through a beam splitter and
   (a) receiving the light at a first one of the two receiving portions when the emitted light is reflected from a glossy one of said polishing surface and said workpiece, and
   (b) receiving the light at a second one of the two receiving portions when the emitted light is reflected from a non-glossy one of said polishing surface and said workpiece.

4. The method according to claim 3, wherein the passing of the reflected light through the beam splitter comprises separating the reflected light into S wave and P wave, with the S wave being received at the first one of the two receiving portions when the emitted light is reflected from a glossy one of said polishing surface and said workpiece, and with the P wave being received at the second one of the two receiving portions when the emitted light is reflected from a non-glossy one of said polishing surface and said workpiece.

5. A method for polishing a workpiece, said method comprising:
   holding a single workpiece to be polished by a single top ring, and pressing said single workpiece against a polishing surface of a turntable by said single top ring, while rotating said turntable and said single top ring, thereby polishing said workpiece;
   detecting the situation of dislodgement of said workpiece from said top ring by a workpiece dislodgement detector comprising a gloss sensor for emitting light, receiving reflected light and detecting said workpiece that is dislodged from said top ring based on a change in a quantity of said reflected light; and
   upon detection of a dislodged workpiece, stopping rotation of said turntable and rotation of said top ring;
   wherein the detecting of the situation of dislodgement of said workpiece from said top ring comprises:
   (i) emitting light;
   (ii) reflecting the emitted light from at least one of said polishing surface and said workpiece; and then
   (iii) receiving the light at at least one of two receiving portions of said gloss sensor,
   and wherein the receiving of the light comprises passing the reflected light through a beam splitter and
   (a) receiving the light at a first one of the two receiving portions when the emitted light is reflected from a glossy one of said polishing surface and said workpiece, and
   (b) receiving the light at a second one of the two receiving portions when the emitted light is reflected from a non-glossy one of said polishing surface and said workpiece.

6. The method according to claim 5, wherein the passing of the reflected light through the beam splitter comprises separating the reflected light into S wave and P wave, with the S wave being received at the first one of the two receiving portions when the emitted light is reflected from a glossly one of said polishing surface and said workpiece, and with the P wave being received at the second one of the two receiving portions when the emitted light is reflected from a non-glossy one of said polishing surface and said workpiece.

7. A polishing apparatus for polishing a workpiece, said apparatus comprising:

a rotatable turntable having a polishing surface;

a single rotatable top ring for holding a single workpiece and pressing the workpiece against said polishing surface of said turntable;

said turntable and said top ring having a respective configurations such that only a single workpiece at a time can be polished; and a workpiece dislodgement detector for, during a polishing operation, detecting the situation that the workpiece is dislodged from said top ring, said detector comprising a gloss sensor for emitting light, receiving reflected light and detecting the workpiece that is dislodged from said top ring based on a change in a quantity of said reflected light, wherein said gloss sensor includes a beam splitter for separating reflected light into S wave and P wave.

8. A polishing apparatus for polishing a workpiece, said apparatus comprising:

a rotatable turntable having, a polishing surface;

a rotatable top ring for holding a workpiece and pressing the workpiece against said polishing surface of said turntable;

a workpiece dislodgement detector for detecting, during a polishing operation, the situation that the workpiece is dislodged from said top ring, said detector comprising a gloss sensor for emitting light, receiving reflected light and detecting the workpiece that is dislodged from said top ring based on a change in a quantity of said reflected light, wherein said gloss sensor includes a beam splitter for separating reflected light into S wave and P wave; and a mechanism, operable in response to said detector detecting a dislodged workpiece, for stopping rotation of said top ring and rotation of said turntable before said turntable has rotated a complete rotation.

* * * * *